(12) United States Patent
Bendall

(10) Patent No.: US 6,509,582 B1
(45) Date of Patent: Jan. 21, 2003

(54) SEMICONDUCTOR PAD CONSTRUCTION ENABLING PRE-BUMP PROBING BY PLANARIZING THE POST-SORT PAD SURFACE

(75) Inventor: R. Evan Bendall, Centerville, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/108,152

(22) Filed: Mar. 27, 2002

(51) Int. Cl.[7] .................................................. H01L 23/58
(52) U.S. Cl. ........................ 257/48; 257/786; 257/781; 438/18; 438/613
(58) Field of Search .......................... 257/48, 786, 401, 257/780, 781; 438/11, 18, 613

(56) References Cited

U.S. PATENT DOCUMENTS

| | | | | |
|---|---|---|---|---|
| 4,628,590 A | * | 12/1986 | Udo et al. | |
| 5,466,348 A | * | 11/1995 | Holm-Kennedy | |
| 5,719,448 A | * | 2/1998 | Ichikawa | |
| 5,844,317 A | * | 12/1998 | Bertolet et al. | |
| 5,854,513 A | * | 12/1998 | Kim | |
| 5,965,903 A | * | 10/1999 | Chittipeddi et al. | |
| 5,969,426 A | * | 10/1999 | Baba et al. | |
| 6,204,074 B1 | * | 3/2001 | Bertolet et al. | |
| 6,407,459 B2 | * | 6/2002 | Kwon et al. | |
| 6,426,556 B1 | * | 7/2002 | Lin | |

* cited by examiner

Primary Examiner—Sheila V. Clark
(74) Attorney, Agent, or Firm—Thomas R. Fitzgerald, Esq.

(57) ABSTRACT

A visual pattern of insulating material is used to guide visually the placement of test probes on a semiconductor wafer. A passivation layer is patterned over the probed areas on the wafer, and then planarized. Planarization of the passivation layer permits reliable addition and retention of an acceptable layer of under bump metal over the planarization after probing is completed. Acceptable test probing of semiconductor device pads may thus be performed before bump connections are fabricated. Each wafer that does not pass testing is eliminated from the bump fabrication process, saving the cost of fabricating bumps on an unusable wafer.

6 Claims, 14 Drawing Sheets

| | | | |
|---|---|---|---|
| ▨ | solder bump | ▨ | SiO / SiN passivation |
| ▨ | plating (UBM) | ▨ | pad Al metallization |
| ▨ | photoresist | ▨ | dielectric (oxide) |
| ▨ | under bump metal | ▥ | polysilicon |
| ▨ | BCB protection passivation | ▨ | pad insulation dielectric |
| ▨ | probe damage | ▨ | wafer silicon |
| ▨ | BCB passivation | | |

Legend

SEMICONDUCTOR PAD CONSTRUCTION ENABLING PRE-BUMP PROBING BY PLANARIZING THE POST-SORT PAD SURFACE

FIELD OF INVENTION

This invention relates to power semiconductor fabrication, and more specifically to the incorporation of test probing of power semiconductor devices in the fabrication process.

DISCUSSION OF PRIOR ART

Rectangular semiconductor pads usually provide both a location to place a probe and a site for making electrical connections to the package or to other components of a system. For wire bonding packaging, although improper probing can create difficulties, no systematic problems exist that prohibit the use of probes to determine whether a device will meet specifications before expensive continued processing and packaging.

For bump connections, however, varying surface patterns caused by probing can cause systematic problems. To quote from current practitioners: "Bumping over probed I/O pads can result in solder explosions, enlarged and diminished bumps. It is very difficult to cover severe probe damage with a thin UBM layer using an evaporation or sputtering process. If the pad metal has been smeared to such an extent that the UBM does not completely coat the smeared I/O pad metallurgy (typically, Al based) poor plating can occur. An enlarged bump is indicative of voids in the solder." (This quote was taken from p. 1 of "Flip Chip Production Experience: Some Design, Process, Reliability, and Cost Considerations", by J. D. Mis, G. A. Rinne, P. A. Deane, and G. M. Adema, MCNC Electronic Technologies Division, Research Triangle Park, N.C.)

A second problem with bumping over I/O pads is that plating chemistry reacts with Al metallization, dissolving it away. Large voids in the solder are a field failure reliability risk.

Thus, probing to determine whether a bump device will meet specifications before expensive future processing is either not possible or very difficult.

The conventional placement of source and gate pads is shown in FIG. 1. The control gate pad 10 occupies one corner of the entire face 5 of the device. The source pad 20 occupies the rest of the face 5. When gate contact bumps 12 and source contact bumps 22 are added as shown in FIG. 2, a single bump 12 is conventionally placed in the middle of the control gate pad 10, and multiple bumps 22 are conventionally placed in an array across the entire source pad 20.

See FIG. 2a for a cross section of the prior art layers. Traditional pad construction consists of a layer or layers 52 of dielectric such as an oxide on a substrate 50, a layer 54 of polysilicon, a layer 56 of conductive metal, one or more passivation layers 58, and a layer 57 of under bump metal (UBM) overlapping passivation layers 58.

Dielectric layer or layers 52 insulates the pad from substrate 50. Conductive metal 56 provides a low resistance interconnect. Polysilicon layer 54 forms a strong adhesive to both oxide 52 and conductive metal 56. Where required, passivation layer 58 protects conductive metal 56 on specified areas of the wafer from scratches. UBM layer 57 provides an anchor for the bump metal and contact with conductive metal 56.

Doped polysilicon layer 54 and conductive metal layer 56 are normally used as a gate material. Polysilicon also serves as part of the device I/O protection circuitry. In the pad area, polysilicon layer 54 and conductive metal layer 56 are in direct electrical contact. To insulate polysilicon layer 54 from conductive metal layer 56 on the device outside of the pad area, a dielectric layer 55 is placed between the two layers. A contact mask defines interconnects between layers 54 and 56 where desired. For pad construction, dielectric layer 55 is usually removed between the metal layer 56 and polysilicon layer 54 to use the excellent adhesive properties of the polysilicon to both metal and dielectric layers.

Probing a wafer to determine its acceptability for operation is usually done after solder bumps have been fabricated over the source and gate pads. Fabricating solder bumps is a difficult and error-prone step. Since conventional probing processes damage the surface and increase the risk of device failure due to such probe damage, probing the device before solder bump fabrication is not conventional practice. FIG. 2b shows the results of an attempt to probe a target area 80 where under bump metal is to be placed and a gate bump is to be fabricated. Probe damage 81 partially penetrates gate metallization 56, and leaves an irregular raised surface 81a. When under bump metal 57 is deposited over surface 81a, the surface 57a of under bump metal 57 substantially follows the surface irregularity of surface 81a. Since probe damage metal is mechanically weaker than the gate metallization, and the surface irregularities contribute to poor adhesion between gate metallization and the overlying conductive layers, the result is increased frequency of failure of bump fabrication processing.

A method of locating a testing area for probe placement may be found in U.S. Pat. No. 5,734,175 (Taniguchi), "Insulated-Gate Semiconductor Device Having a Position Recognizing Pattern Directly on the Gate Contact Area". The '175 patent forms a visible wiring pattern in the gate contact area for wire bonding, but offers no pattern in the source contact area, and does not address the unique requirements of bump contact technology.

SUMMARY

The invention places a visual pattern of insulating material on a semiconductor wafer to guide visually the placement of test probes in device probe areas. To allow probing before bump fabrication, the invention fabricates a passivation layer over probed areas, and planarizes the passivated probed areas, permitting reliable addition of an acceptable layer of under bump metal over the probed area after probing is completed. A gate bump is then fabricated directly over the probed area. These steps facilitate acceptable :test probing of semiconductor device pads before bump connections are fabricated. The invention's approach eliminates from the bump fabrication process every wafer that fails testing, saving the cost of bumping wafers that will be unusable due to low electrical yield.

LIST OF REFERENCE NUMERALS

DETAILED DESCRIPTION OF INVENTION

Figure 3:
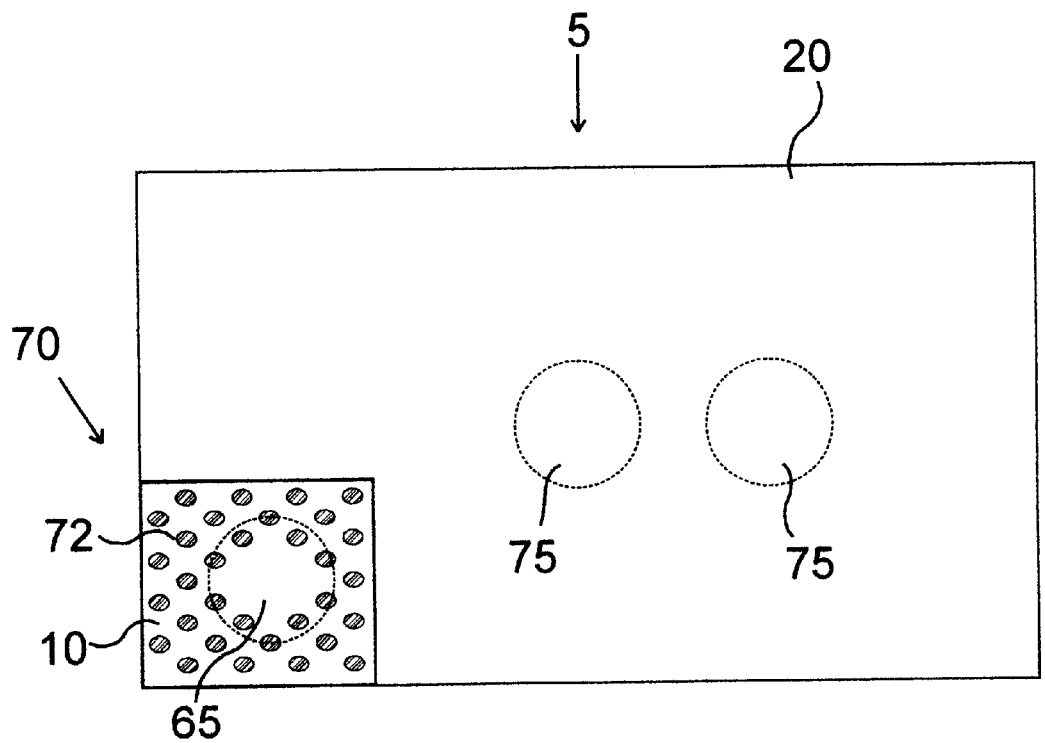
FIGS. 3 and 3a shows a plan view of the invention's gate and source pads, with a gate probe location marked by a visible pattern, and source probe locations established by fixed relationships with the gate probe location.

The invention begins with a semiconductor wafer on which each production device has been fabricated with source and gate contact areas on one face and drain contact areas on the opposite face. See FIG. 3. The invention uses a contact mask to fabricate a visual pattern 70 in gate contact area 10, in the dielectric layer between the poly silicon and the metal layer fabricated later. Visual pattern 70 appears as a matrix of dots 72, each dot formed by the presence of a deposited area of dielectric visible through the overlying conducting metal layer. The dots contrast in appearance with the spaces between them. In the spaces between dots, the absence of deposited dielectric leaves the layer of polysilicon visible through the overlying conducting metal layer.

Figure 4:
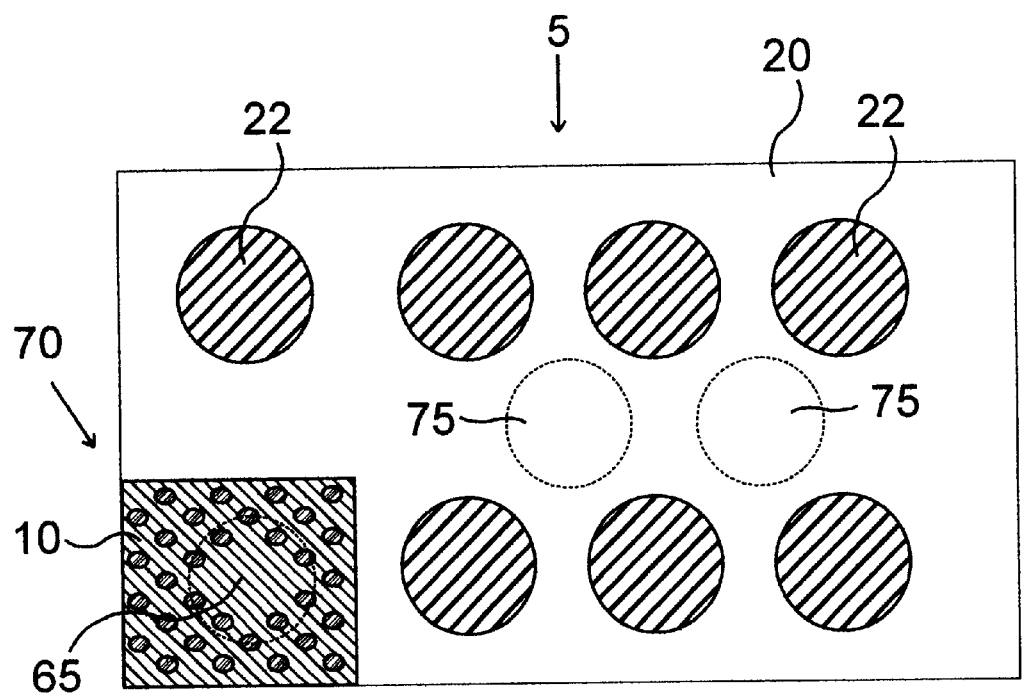
FIG. 4 shows a plan view of the invention's gate and source pads, with a gate probe location marked by a pattern, and source bumps fabricated.
Figure 3A:
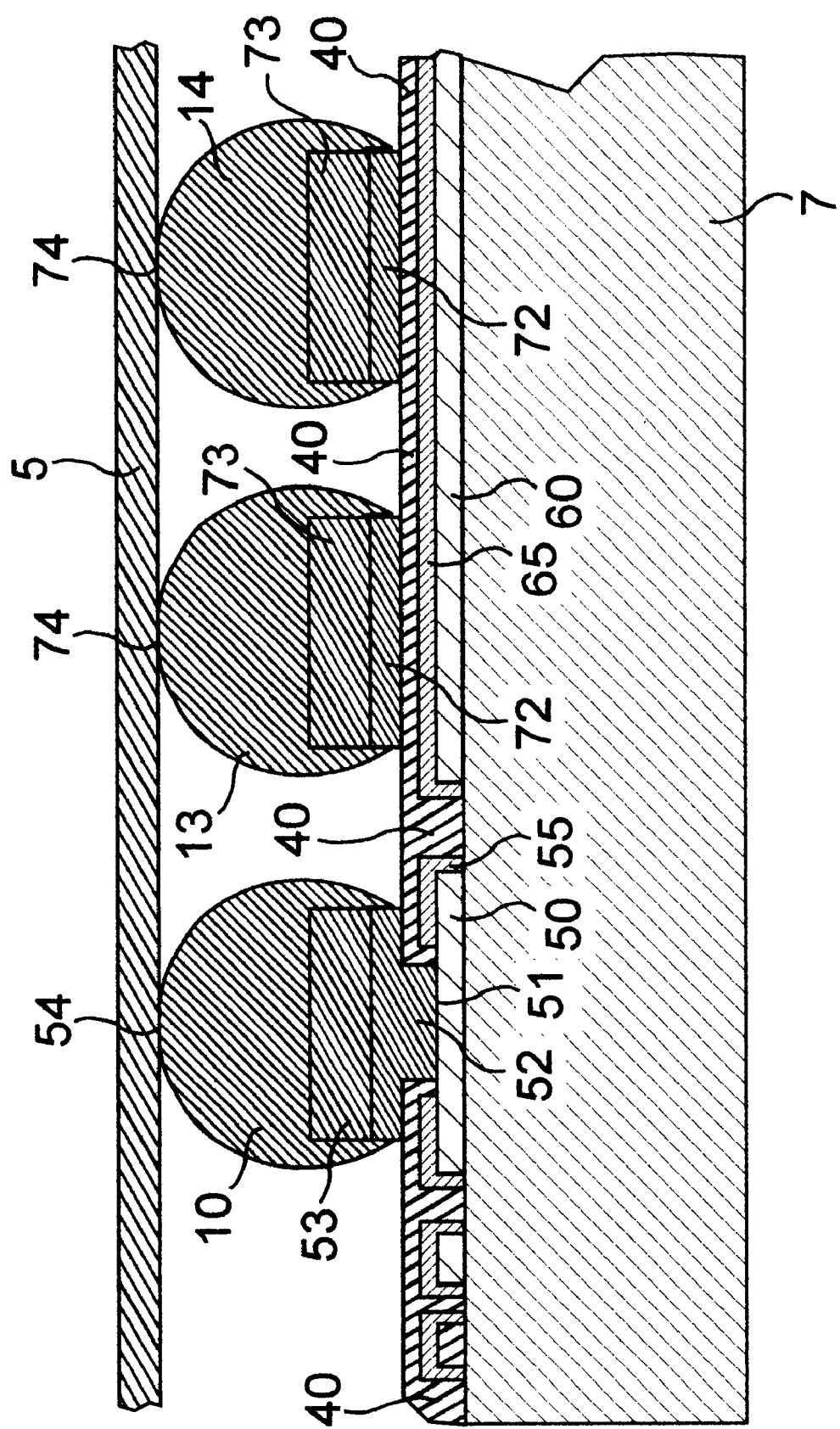

See FIG. 4. Visual pattern 70 is placed in gate pad area 10. The design of visual pattern 70 provides space 65 designating an area in which a gate probe may be used. By visual alignment to area 65, the gate probe may be accurately placed. On source pad 20 serving source connections, probe areas 75 are offset from areas where source bumps 22 are to be placed. The probe card carries both gate and source probes. By designing and orienting the probe card, source probes can be accurately placed in probe areas 75 based solely on the placement of the gate probe in area 65.

The source probe area offset from source bump areas is necessary because probe damage under a source bump, combined with the planarized passivation layer above it, would restrict the cross-section of device current flow, raising the drain-source on-resistance and degrading the operational performance of the device.

On smaller pad 10 serving gate connections, visual pattern 70 directs the probe to the center of the area 65 where gate bump 12 is to be placed. Gate bumps are fabricated directly over probed area 65. The gate connection to the conductive metal layer under a gate bump is formed in an annulus around the probed area. In contrast to source connection requirements, the added resistance caused by the presence of probe damage is not an issue. After probing, the protection passivation layer consisting of BCB is added and then the UBM. The UBM comprises a first layer of Ti and a second layer of Cu.

Figure 1:
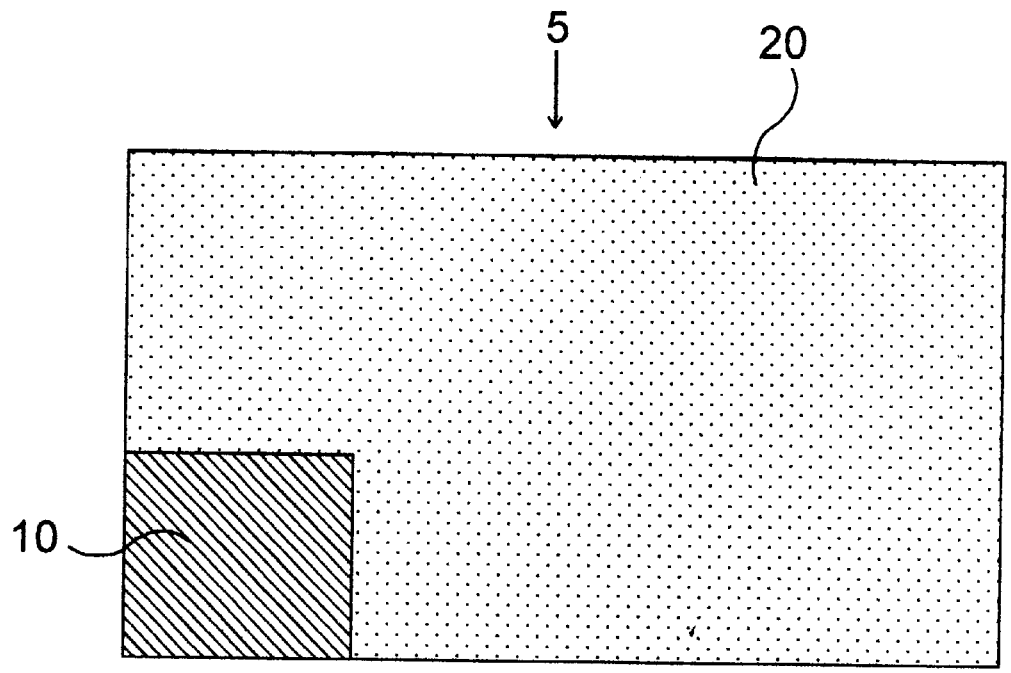
FIG. 1 shows a plan view of a prior art device with gate and source pads.
Figure 2:
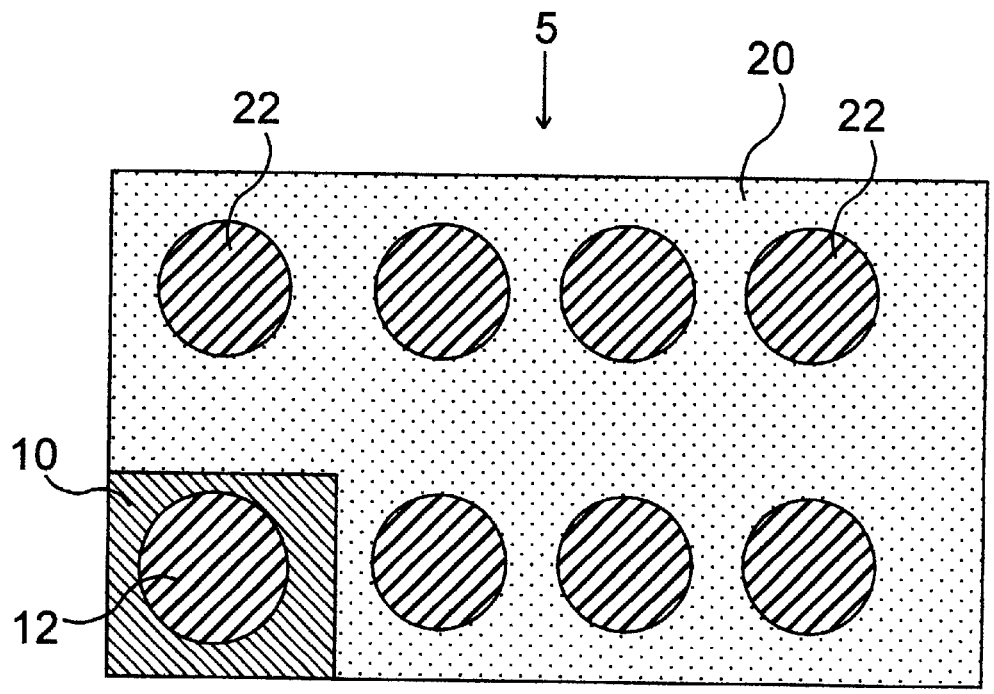
FIG. 2 shows a plan view of a prior art device with gate and source pads, and gate and source bumps.
Figure 2A:
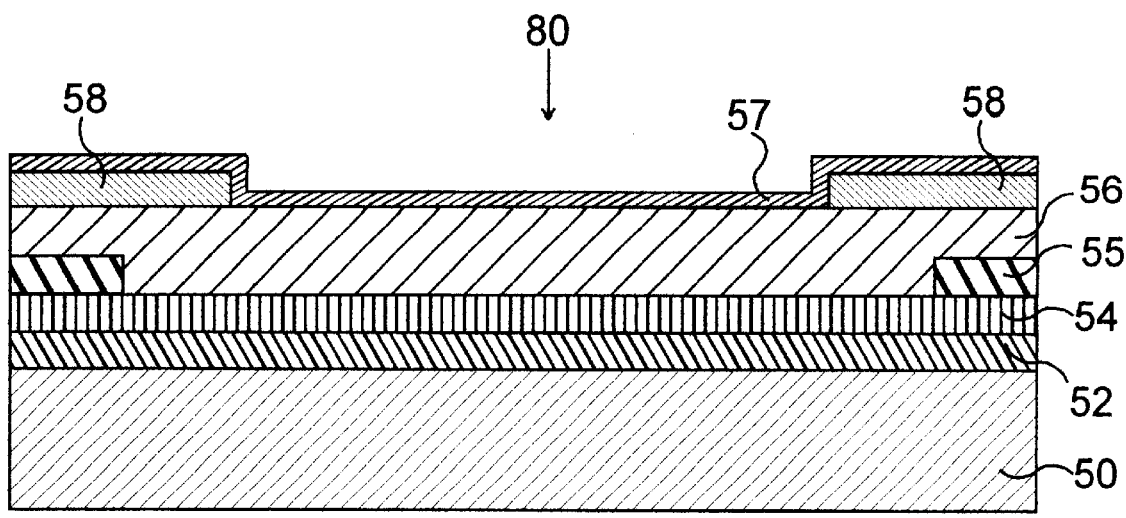
FIG. 2a shows a cross section of a prior art device in the gate bump region.
Figure 2B:
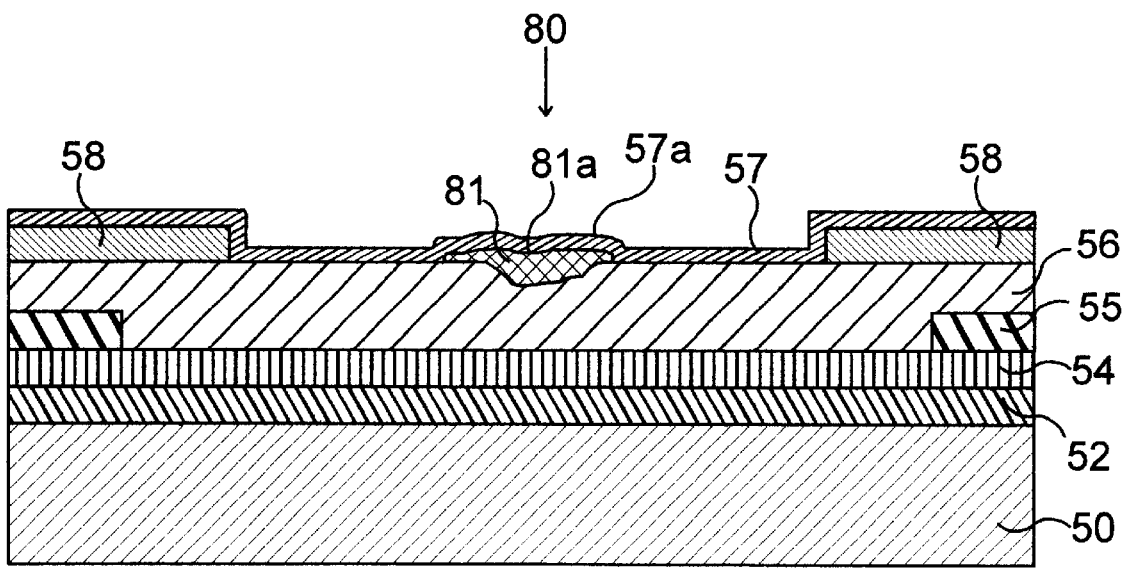
FIG. 2b shows a cross section of a prior art device in the gate bump region, and a treatment of probe damage.
Figure 5:
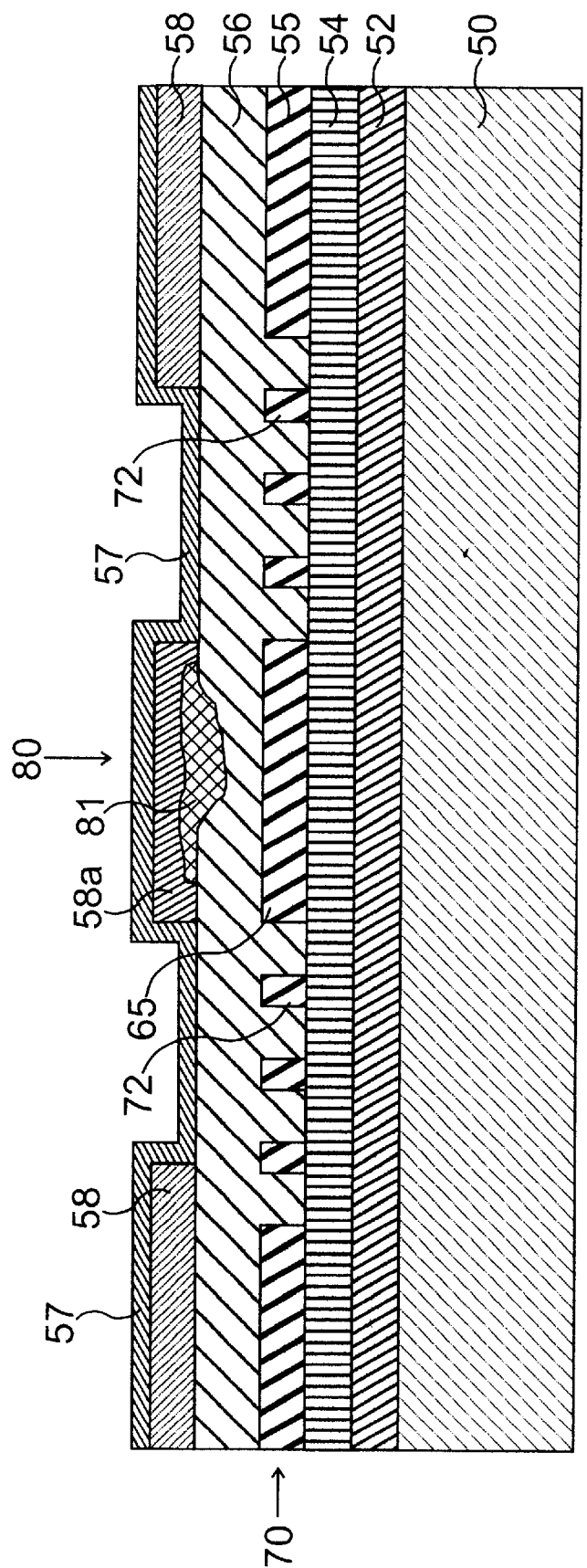
FIG. 5 shows a cross section of the invention's gate bump as fabricated over probe damage.

See FIG. 5, which shows the same cross section as in FIG. 2a but includes visual pattern 70 according to the invention. Visual pattern 70 shows a gate target area 80 on which a probe has made contact, causing probe damage 81 both on and in metal layer 56. Probing thins metal layer 56 while adding metal from the probe and mingling it with metal from metal layer 56 to leave probe damage 81 with irregular surface contours as shown. To limit the scope and effect of such probe damage, a BCB (divinylsiloxane bis-benzocyclobutene) passivation layer 58a is added over and extending laterally beyond the surface boundaries of probed area 80. BCB is a low k organic dielectric polymer. In this example, BCB is used as the material of the passivation layer 58a is used. The layer 58a can be made of other material which is thermally deformable. Specifically, polyimide, PSG, BPSG, spin on glass (SOG), polyallylate, and the like may be used. Passivation layer 58a is planarized, to form a good adhering surface for subsequent addition of metal layers. Under bump metal 57 is then added in order to provide electrical connection as required for any bump placed atop passivation layer 58a and probed area 80. UBM 57 contacts conductive metal layer 56 outside probed area 80.

This invention places BCB over all areas 80 in the pads which were probed. BCB (benzocyclobutene) has excellent planarization properties. If BCB is placed over a rough contour such as probe damage 81, the planarized top side of the BCB will be smooth.

Figure 6:
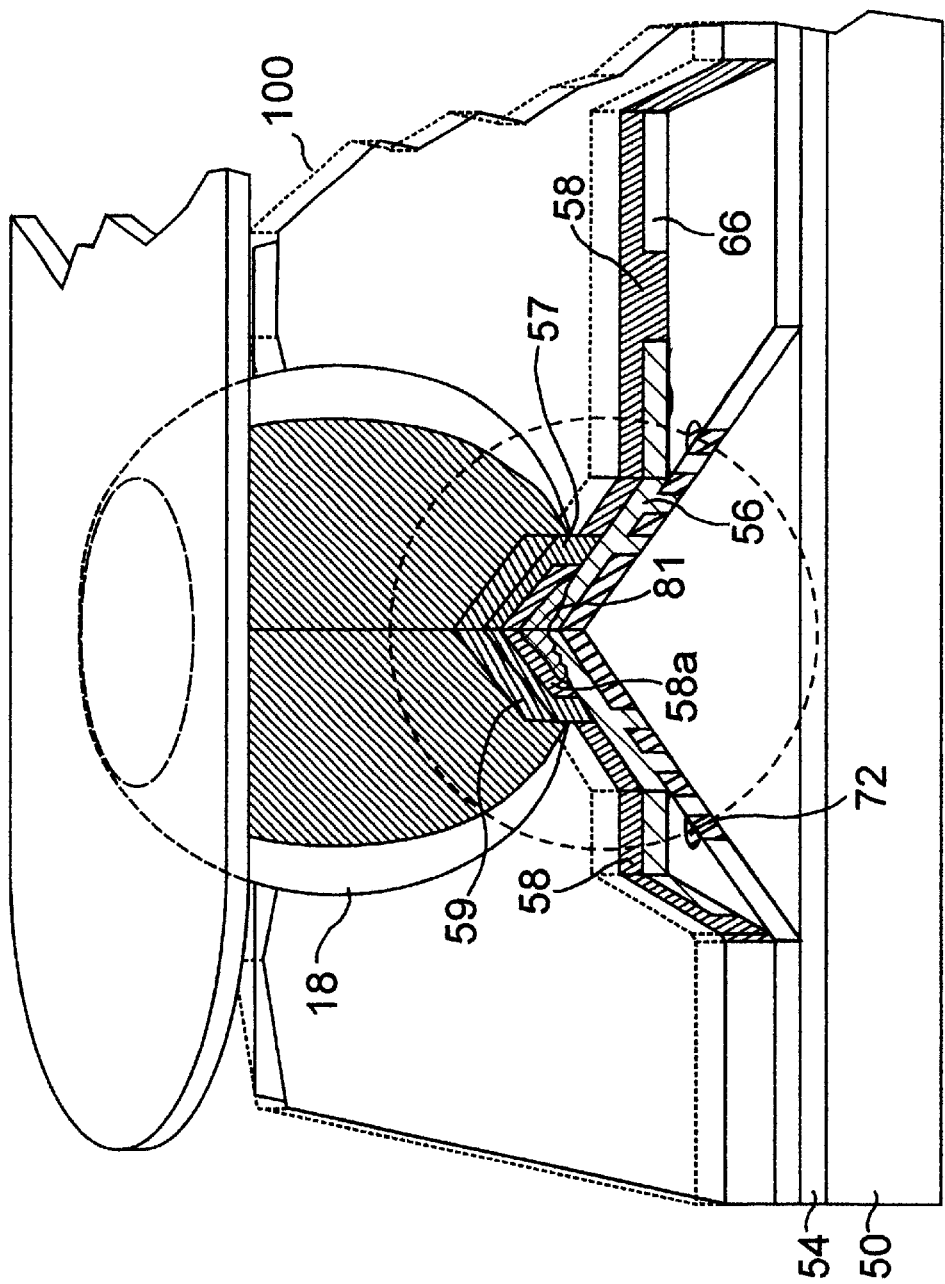
FIGS. 6 and 6a show cutaway views of the invention's gate bump as fabricated over probe damage. A legend is included with FIG. 6a for the meaning of each layer pattern in the figures.
Figure 6A:
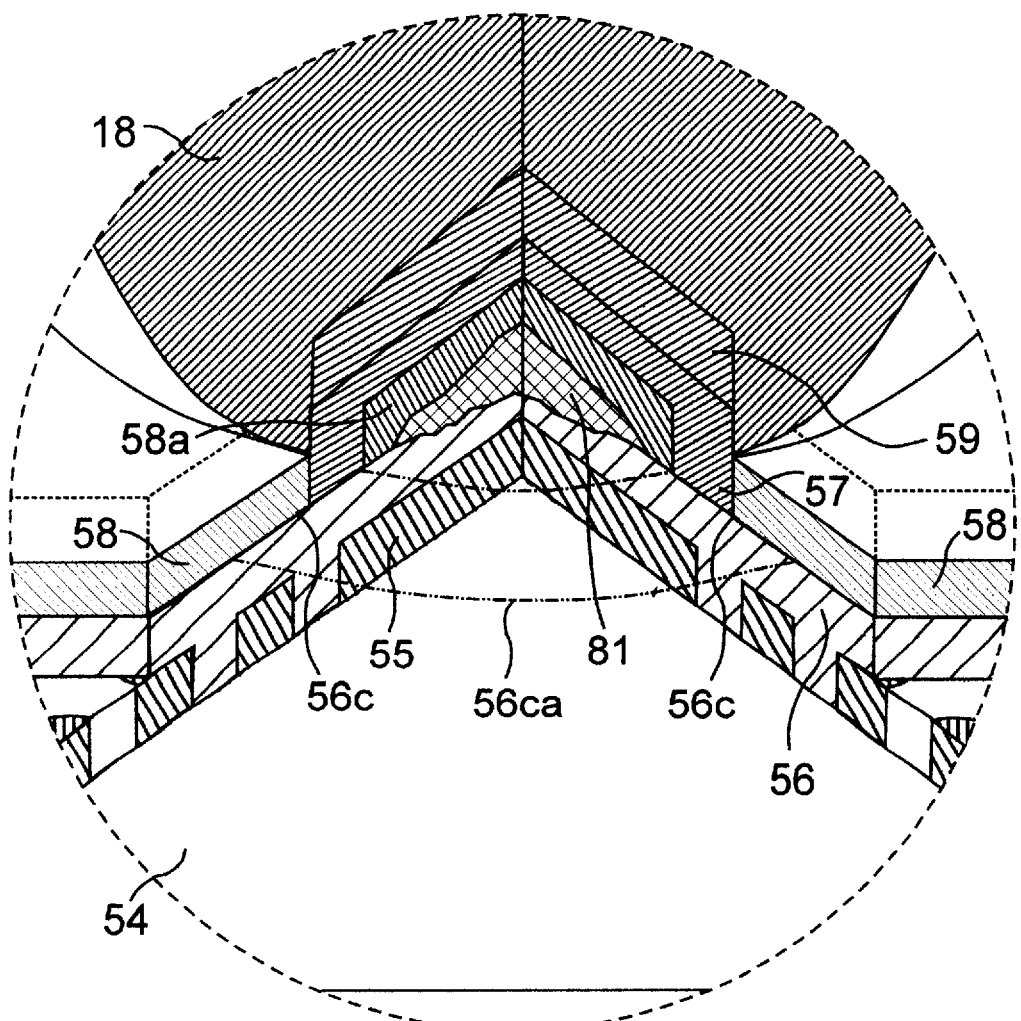

FIG. 6 shows a cutaway view of a gate bump region fabricated according to the invention. The cutaway view of FIG. 6 shows clearly how probe-damaged area 81 is completely enclosed between conductive metal layer 56 and planarized BCB passivation layer 58a. Dotted lines show where an overlying insulating layer 100 may be placed for overall protection of the pad surfaces except where bumps are fabricated. Source under bump metal 66 is also shown for orientation purposes. FIG. 6a shows a detailed view of the center of FIG. 6, and cross-sections 56c of the annular gate contact region 56ca between conductive metal layer 56 and under bump metal 57.

Post-sort planarization is done for both gate and source probe areas. Since source probing is not done in the area where source bumps are to be fabricated, it is not shown in FIGS. 7–20, but the probe, passivation, and planarization steps for the source probe areas are the same as for the gate probe areas. The fabrication of contacts using post-sort planarization according to the invention proceeds as follows.

Figure 7:
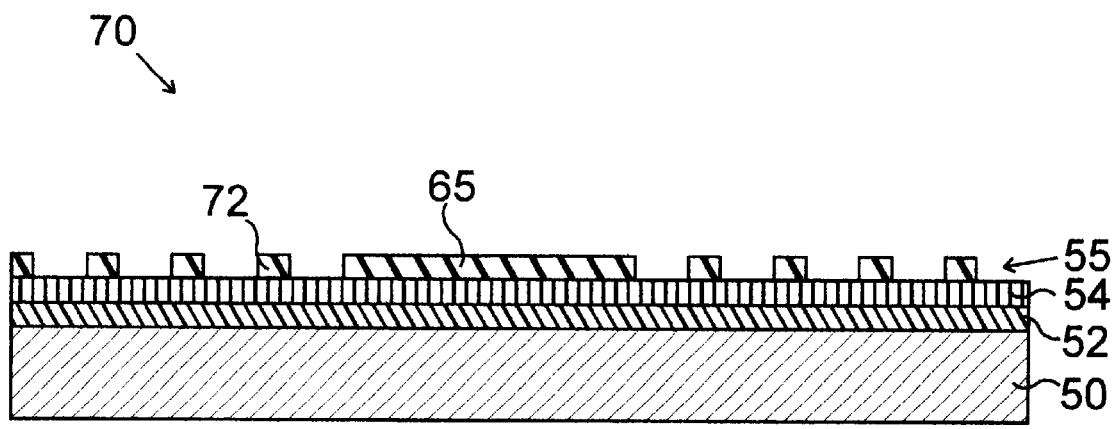
FIGS. 7 through 20 show a device fabrication process incorporating the invention's probe, passivation, and planarization steps.
Figure 8:
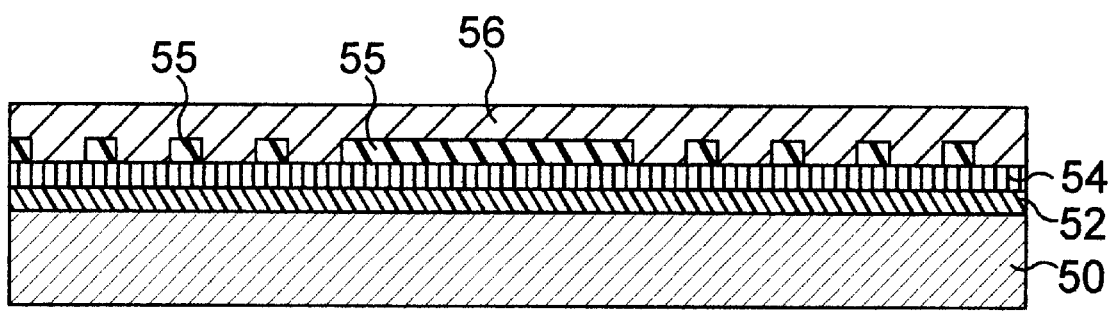
Figure 9:
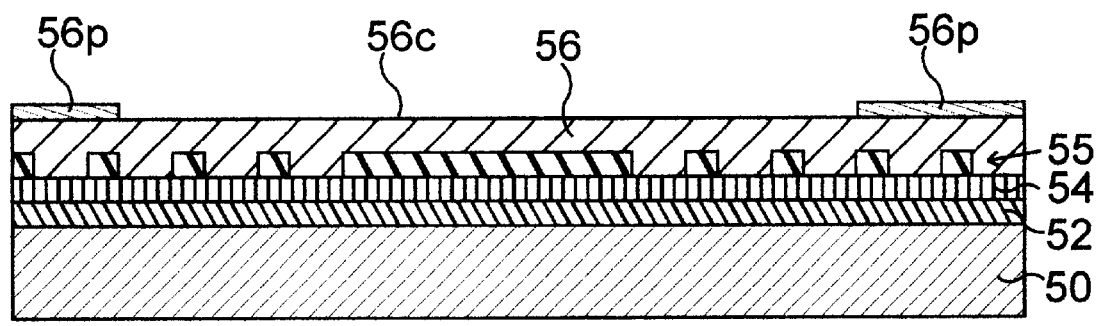

See FIG. 7. A semiconductor wafer 50 has gate oxide layer 52 and polysilicon layer 54 already in place. Dielectric layer 55 is patterned over polysilicon layer 54 using a contact mask, to provide a visual pattern 70 for guiding probe placement to the areas where gate bumps are to be fabricated, and for insulating gate metal from underlying layers outside the gate pad area. As shown in FIG. 8, gate Al metallization 56 is then layered over dielectric layer 55. FIG. 9 shows an optional silicon oxide or silicon nitride passivation 56p layered over the gate metal to provide physical protection, with an opening fabricated in passivation layer 56p to expose gate contact 56c. As with gate metallization, silicon oxide or silicon nitride passivation is layered over the source Al metallization to provide protection for the metal layer outside the probed areas. Source contacts may be similarly exposed by openings in the source passivation layer. No visual pattern for guiding source probe placement is needed, because the construction of probe cards insures that source probes are accurately placed relative to the targeted gate probe. The source probes are placed in locations offset from areas where source bumps are to be fabricated. See FIGS. 3 and 4.

Figure 10:
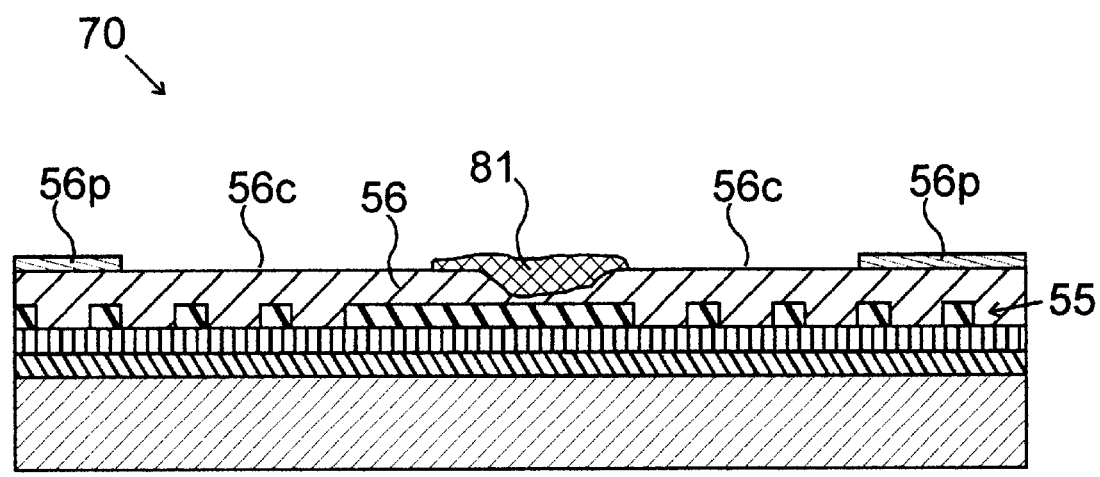

At this point in the fabrication process, probing is performed on gate contact 56c, creating gate probe damage 81 as shown in FIG. 10. Probing is also performed on source probe areas, creating similar probe damage. All wafers failing probe-based testing at this point are sorted and removed from the fabrication process.

Figure 11:
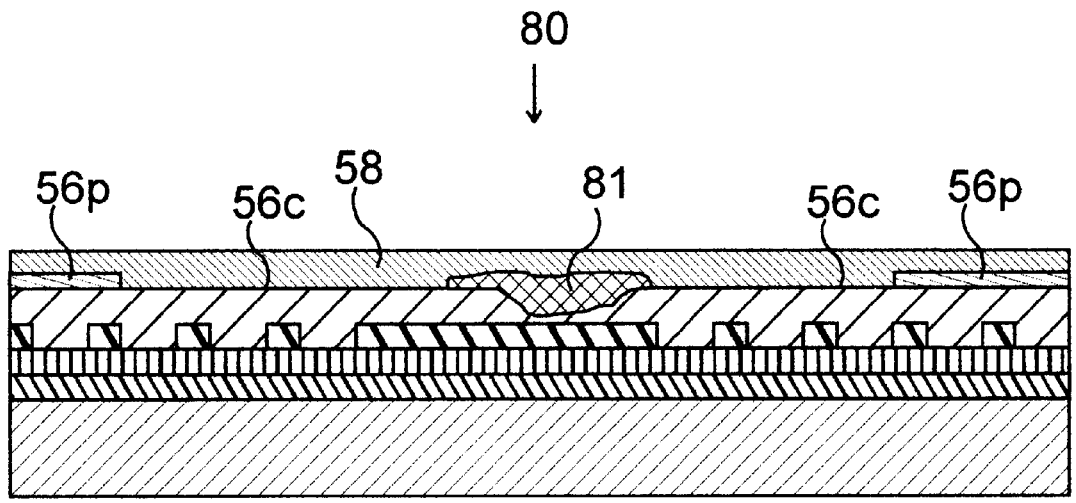
Figure 12:
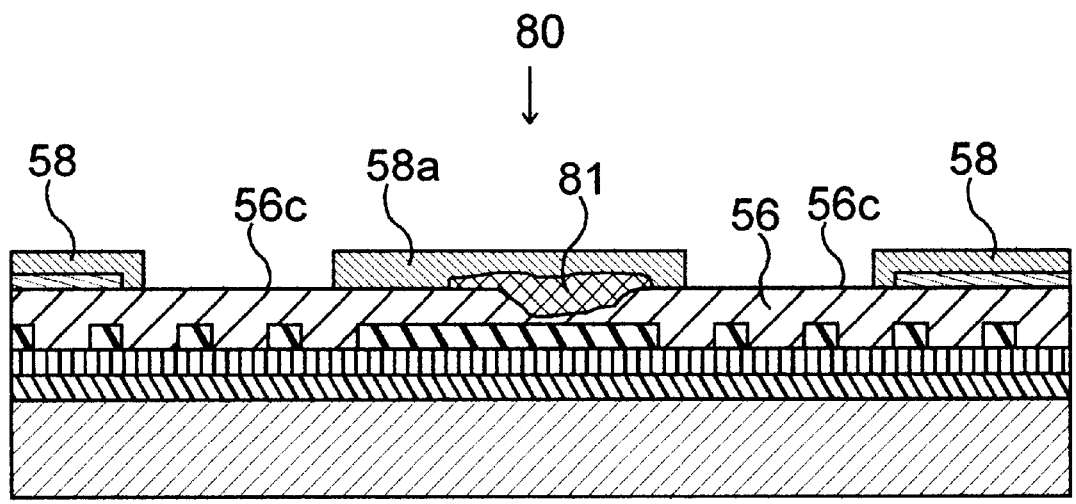

See FIGS. 11 and 12. A BCB layer 58 is coated and baked on the wafer as shown. The BCB is exposed to define the exposed gate contact 56c, protection passivation area 80, and exposed source contacts and source protection passivation areas, and then developed to expose contact 56c, and cover gate probe damage 81 and source probe damage with protection passivation layer 58a. BCB layer 58, 58a is planarized, to give the result shown in FIG. 12. One or more additional BCB layers may be layered, patterned, and planarized as needed.

Figure 13:
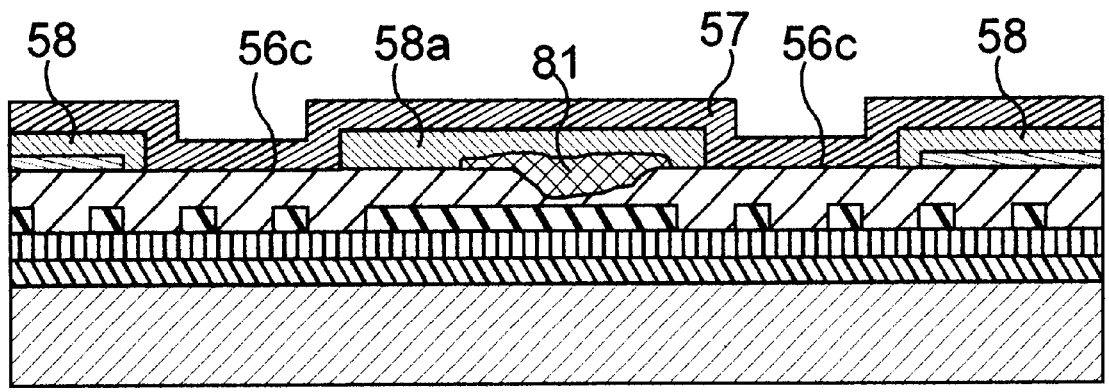
Figure 14:
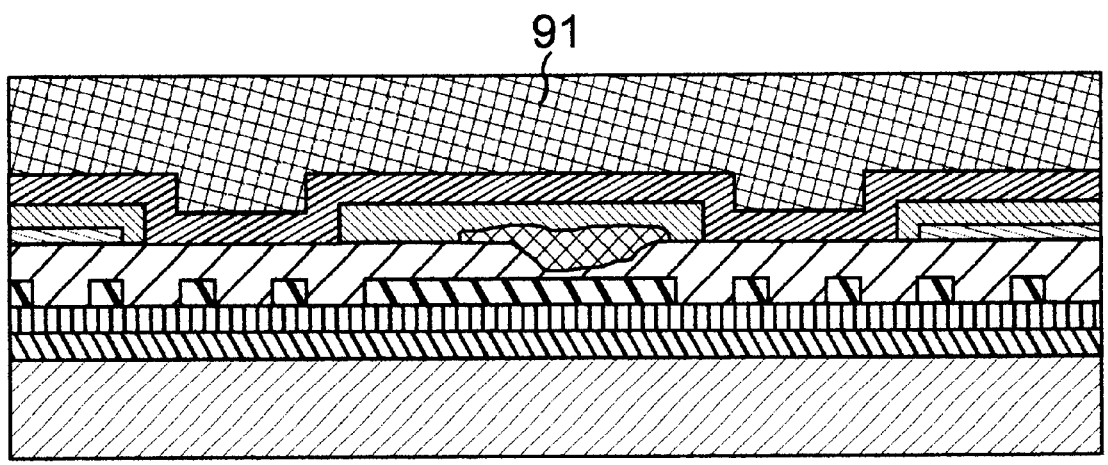
Figure 15:
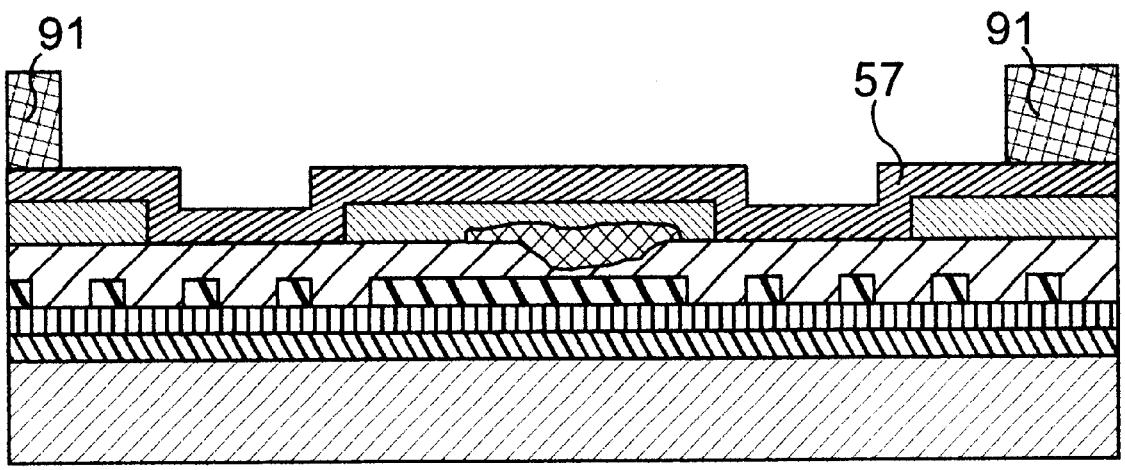
Figure 16:
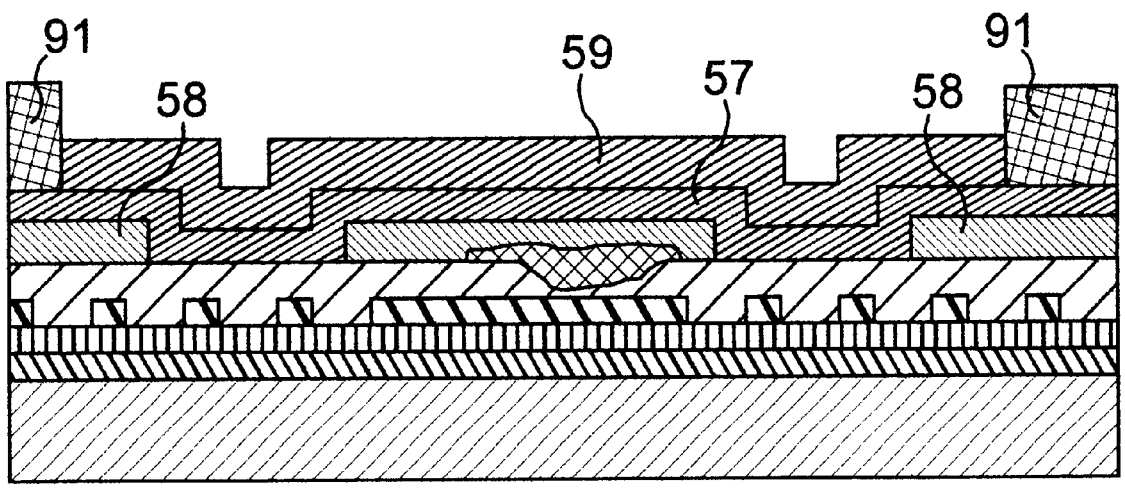
Figure 17:
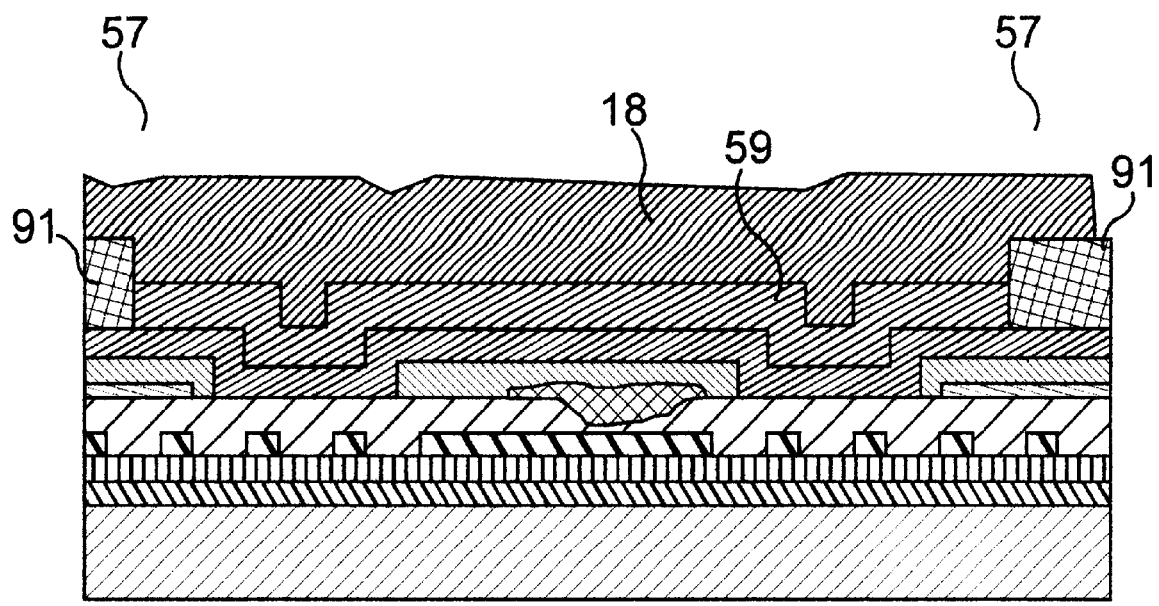
Figure 18:
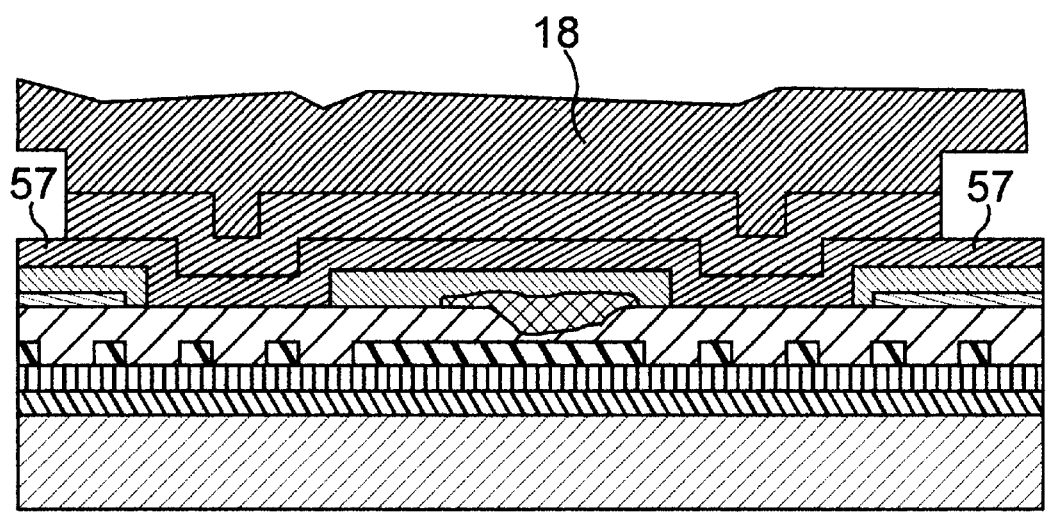
Figure 19:
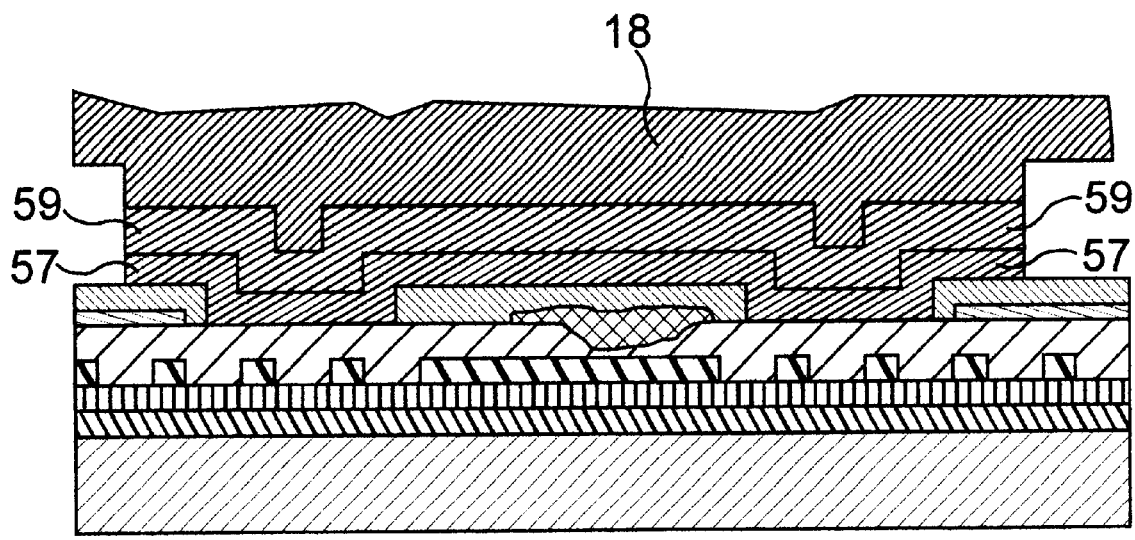
Figure 20:
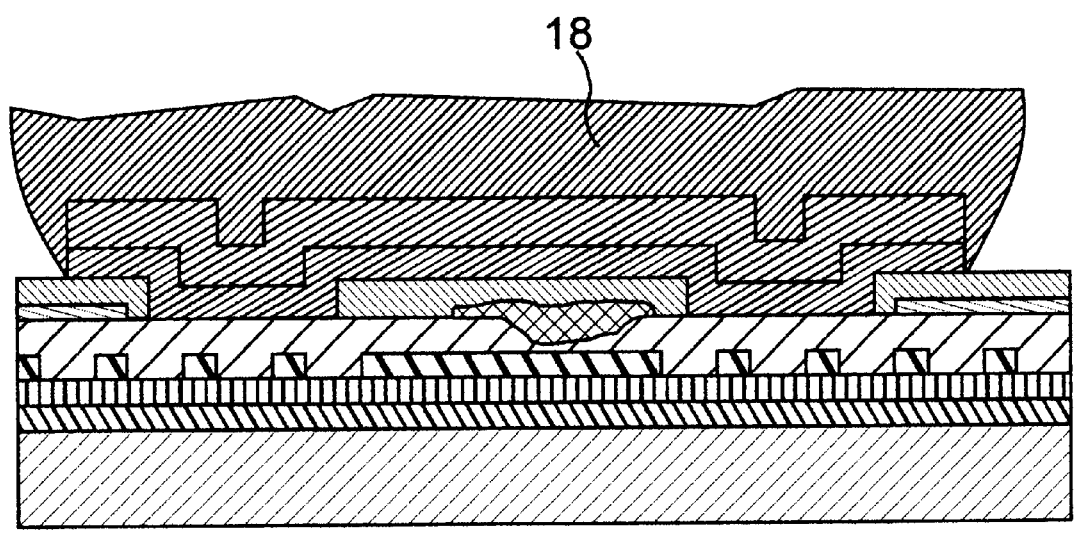

An under bump metal 57, such as Ti followed by Cu, is then sputtered onto gate contact 56c and planarized BCB layer 58, 58a for overall metallization (FIG. 13). A thick photoresist coating 91 is added (FIG. 14), UV-exposed and developed to expose the areas (FIG. 15) where Cu 59 is to be plated onto exposed UBM 57. Cu 59 is plated onto exposed under bump metal 57, as shown in FIG. 16, to ensure retention of bulk copper interconnect after the soldering process, since part of the copper is consumed with the formation of intermetallics with adjacent metal layers. Gate solder bump 18 is plated onto Cu 59 (FIG. 17), with photoresist 92 supporting the edges of the bumps around Cu 59. Photoresist 92 is stripped (FIG. 18) to expose UBM 57. UBM 57 is etched to define final circuitry (FIG. 19) and plated solder bump 18 is reflowed (FIG. 20) to form the final solder bump. Additional steps to provide final protective insulating layers are conventional, and are not shown.

Conclusion, Ramifications, and Scope of Invention

From the above descriptions, figures and narratives, the invention's advantages in early probing of gate contacts should be clear. The invention connects source conductive metal layers to source bumps and gate conductive metal layers to gate bumps after test probing is completed. The conventional practice is to perform probing after bump fabrication. The invention's reversal of order of these steps saves the expense and time of fabricating bumps on devices that fail testing. The invention achieves this savings by locating areas to be probed as shown, and, for the devices that pass testing, planarizing the passivation layer fabricated over probe damage in the specified areas probed, thereby preserving the performance and reliability characteristics of each such device.

Although the description, operation and illustrative material above contain many specificities, these specificities should not be construed as limiting the scope of the invention but as merely providing illustrations and examples of some of the preferred embodiments of this invention.

Thus the scope of the invention should be determined by the appended claims and their legal equivalents, rather than by the examples given above.

What is claimed:

1. A semiconductor apparatus fabricated with bump contacts, comprising:

a semiconductor body having a first surface and a second surface;

a source contact area on the first surface of the semiconductor body, showing a visible pattern for positioning source test probes;

a drain contact area on the second surface of the semiconductor body;

a gate contact area on the first surface of the semiconductor body and separate from the source contact area, showing a visible pattern for positioning gate test probes;

a source contact metallization layer over the source contact area;

a gate contact metallization layer over the gate contact area;

one or more source contact probed areas each overlying and partially penetrating an exposed area of the source contact metallization layer;

one or more gate contact probed areas each overlying and partially penetrating an exposed area of the gate contact metallization layer;

one or more passivating layers overlying the probed areas for covering the probed areas and for electrically insulating the probed areas;

solder bumps for contacting the gate and the source contact metallization layers.

2. The apparatus of claim 1 wherein the passivating layer comprises a thermally deformable insulating material.

3. The apparatus of claim 2 wherein the thermally deformable insulating material is one selected from the group consisting of BCB, polyimide, PSG, BPSG, spin on glass (SOG), or polyallylate.

4. A method of fabricating gate and source bump contacts on a semiconductor device, comprising the steps of:

with a semiconductor wafer having a gate oxide layer and a gate polysilicon layer already in place on a first surface of the wafer, fabricating a dielectric layer over the polysilicon layer using a contact mask to insulate gate conductive metal outside gate pad areas and to provide a visual pattern specifying gate test probe placement sites and source test probe placement sites;

depositing a gate metallization layer over the dielectric layer;

depositing a source metallization layer over the dielectric layer;

depositing a first passivation layer over the gate metallization layer and the source metallization layer, leaving gate contact openings exposing the gate metallization layer and source contact openings exposing the source metallization layer;

applying test probes to the gate metallization layer via the gate contact openings and to the source metallization layer via the source contact openings, to test the semiconductor device for proper functioning;

if the semiconductor device fails the tests using the test probes, discarding the semiconductor device;

if the semiconductor device passes the tests using the test probes, depositing one or more second passivation layers to cover at least the test probe placement sites;

planarizing the one or more second passivation layers;

depositing an under bump metal layer over the planarized second passivation layers;

fabricating gate and source bumps on the under bump metal layer.

5. The method of claim 4 wherein the step of depositing a second passivation layer comprsises depositing a thermally deformable dielectric layer.

6. The method of claim 5 wherein the thermally deformable dielectric layer is a layer of material selected from the group consisting of BCB, polyimide, PSG, BPSG, spin on glass (SOG), or polyallylate.

* * * * *